United States Patent
Kim et al.

(10) Patent No.: US 12,183,580 B2
(45) Date of Patent: *Dec. 31, 2024

(54) METHOD OF MANUFACTURING A SEMICONDUCTOR DEVICE

(71) Applicant: SK hynix Inc., Gyeonggi-do (KR)

(72) Inventors: Ji Hoon Kim, Gyeonggi-do (KR); Jae Han Park, Gyeonggi-do (KR); Chang Hun Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/328,790

(22) Filed: Jun. 5, 2023

(65) Prior Publication Data

US 2023/0317454 A1    Oct. 5, 2023

Related U.S. Application Data

(63) Continuation of application No. 17/459,681, filed on Aug. 27, 2021, now Pat. No. 11,710,635.

(30) Foreign Application Priority Data

Feb. 22, 2021  (KR) ........................ 10-2021-0023612

(51) Int. Cl.
*H01L 21/033* (2006.01)
*H01L 21/311* (2006.01)

(52) U.S. Cl.
CPC ...... *H01L 21/0337* (2013.01); *H01L 21/0332* (2013.01); *H01L 21/0338* (2013.01); *H01L 21/31144* (2013.01)

(58) Field of Classification Search
None
See application file for complete search history.

(56) References Cited

U.S. PATENT DOCUMENTS

2015/0340459 A1*  11/2015  Lee .................... H01L 21/31
                                                        438/585
2016/0233223 A1*   8/2016  Song ................. H01L 21/0214

* cited by examiner

*Primary Examiner* — Roberts P Culbert
(74) *Attorney, Agent, or Firm* — IP & T GROUP LLP

(57) ABSTRACT

The present invention is related to a method for fabricating a semiconductor device capable of forming fine patterns. The method for fabricating the semiconductor device according to the present invention may comprise forming an etch mask layer on an etch target layer; forming a spacer structure in which first spacers and second spacers are alternately disposed and spaced apart from each other on the etch mask layer; forming first spacer lines through selective etching of the first spacers; forming second spacer lines through selective etching of the second spacers; and etching the etch target layer to form a plurality of fine line patterns using the first and second spacer lines.

8 Claims, 14 Drawing Sheets

METHOD OF MANUFACTURING A SEMICONDUCTOR DEVICE

CROSS-REFERENCE TO RELATED APPLICATIONS

The present application is a continuation of U.S. patent application Ser. No. 17/459,681 filed on Aug. 27, 2021, which claims priority to Korean Patent Application No. 10-2021-0023612, filed on Feb. 22, 2021. The disclosure of each of the foregoing application is incorporated herein by reference in its entirety.

BACKGROUND

1. Field

The present disclosure relates to a semiconductor device and, more particularly, to a method for fabricating a semiconductor device including fine patterns.

2. Description of the Related Art

Various patterns are formed during a semiconductor device fabrication. There is a limit to minimizing the critical dimension of a pattern by using general photolithography. Accordingly, there is a need for a technology realizing a critical dimension that exceeds the critical resolution of photolithography.

SUMMARY

Various embodiments of the present disclosure provide a method for fabricating a semiconductor device capable of forming fine patterns.

According to an embodiment of the present invention, a method for fabricating a semiconductor device comprises: forming an etch mask layer on an etch target layer; forming a spacer structure in which first spacers and second spacers are alternately disposed and spaced apart from each other on the etch mask layer; forming first spacer lines through selective etching of the first spacers; forming second spacer lines through selective etching of the second spacers; and etching the etch target layer to form a plurality of fine line patterns using the first and second spacer lines.

According to an embodiment of the present invention, a method for fabricating a semiconductor device comprises: forming a spacer structure in which first and second spacers extending in a first direction are spaced apart from each other and alternately disposed along a second direction on a bit line conductive layer; forming first spacer lines having end portions that are aligned with a third direction, the third direction intersecting with the first direction, through a selective etching of the first spacers; forming second spacer lines having end portions that are aligned with a fourth direction, the fourth direction being parallel with the third direction, through a selective etching of the second spacers; and etching the bit line conductive layer using the first and second spacer lines to form even bit lines having end portions aligned with the third direction and odd bit lines having end portions aligned with the fourth direction.

According to an embodiment of the present invention, a method for fabricating a semiconductor device comprising forming an etch mask layer on an etch target layer; forming first and second spacers, each extending in a first direction, the first and second spacers being alternately arranged to be spaced apart from each other on the etch mask layer along a second direction; forming first spacer lines through selective etching of the first spacers; forming second spacer lines through selective etching of the second spacers; and etching the etch target layer to form a plurality of fine line patterns using the first and second spacer lines, wherein the first and second spacer lines form a zig-zag pattern along the second direction, wherein first ends of the first spacer lines are aligned along the second direction in a first line, wherein first ends of the second spacer lines are aligned along the second direction in a second line parallel to the first line, and wherein the first and second lines are parallel to the second direction.

In the present disclosure, spacer lines formed of different materials are cut with two cut mask layers, while the length of the line pattern can be adjusted by using mis-align between the two cut mask layers and the difference in the etch rates of the spacer lines.

An object of the present disclosure is to improve the contact margin of contact plugs connected to ends of conductive lines by arranging the ends of the conductive lines in a zig-zag manner through selective adjustment of the conductive line lengths.

These and other features and objects of the present disclosure will become apparent to one of ordinary skill in the art from the following drawings and detailed description of various embodiments of the present invention.

DETAILED DESCRIPTION

Figure 1A:
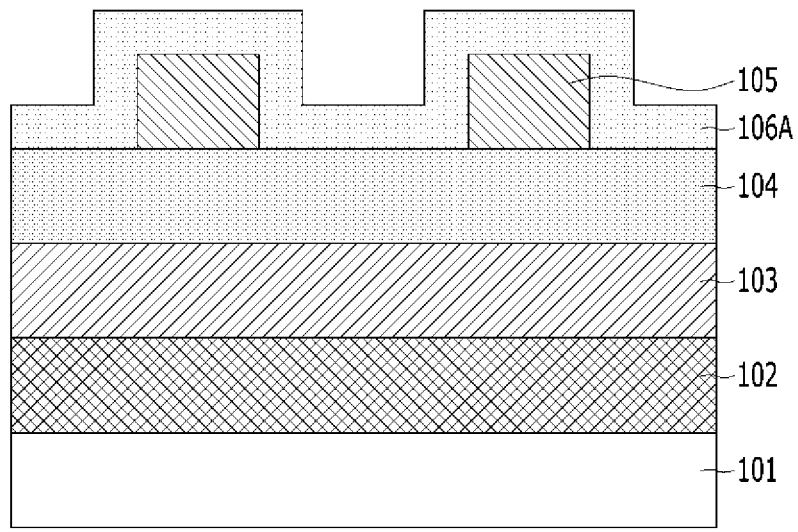
FIGS. 1A to 12B are plane views illustrating a method for fabricating a semiconductor device according to an embodiment of the present invention.

Various embodiments described herein will be described with reference to cross-sectional views, plane views and block diagrams, which are ideal schematic views of the present invention. Therefore, the structures of the drawings may be modified by fabricating technology and/or tolerances. The embodiments of the present invention are not limited to the specific structures shown in the drawings, but include any changes in the structures that may be produced according to the fabricating process. Also, any regions and shapes of regions illustrated in the drawings having schematic views, are intended to illustrate specific examples of structures of regions of the various elements, and are not intended to limit the scope of the invention.

First, for a better understanding of the present invention, a related technique will be explained before describing the present invention.

Double patterning techniques (DPT) have been developed to realize fine patterns exceeding the resolution of photolithography techniques. An example of a double patterning technique is the spacer patterning technique (SPT). In the spacer patterning technique, a sacrificial pattern is formed, and a spacer is formed on both sidewalls of the sacrificial pattern. Subsequently, the sacrificial pattern is removed, and the remaining spacer is used as an etch mask. The spacer patterning technique is suitable for forming repetitive patterns, i.e., identical patterns which are repetitively disposed to be spaced apart from each other at a constant interval.

FIGS. 1A to 12B are plane views illustrating a method for fabricating a semiconductor device according to an embodiment of the present invention.

Figure 1B:
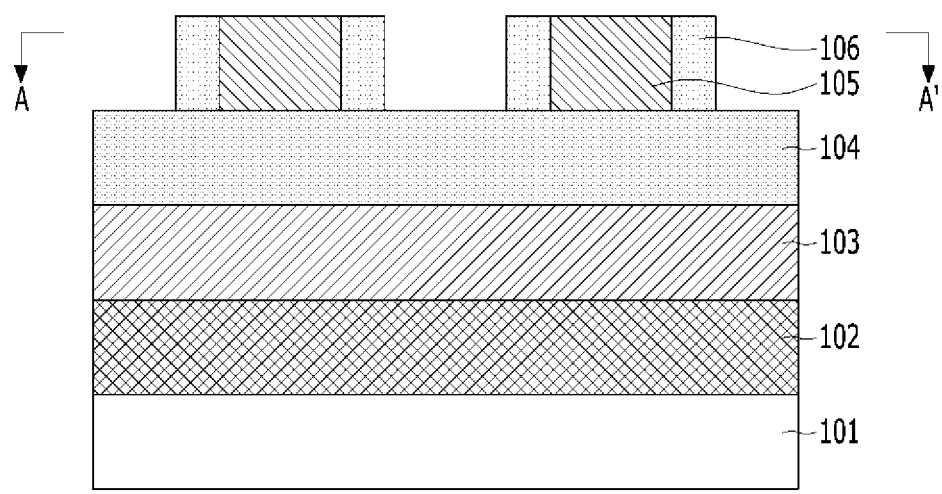
Figure 1C:
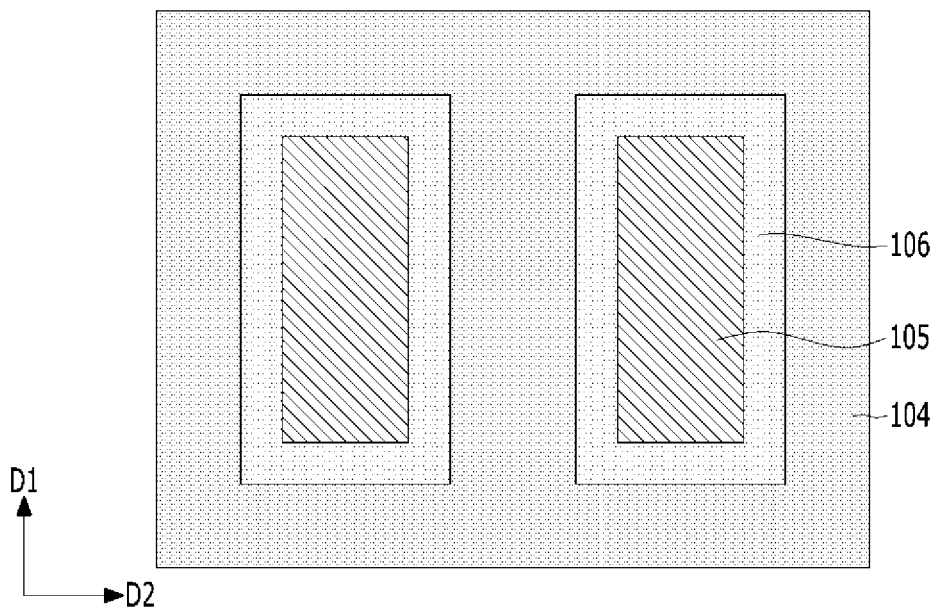

According to FIGS. 1A to 1C, an etch target layer 102 may be formed on a substrate 101. The substrate 101 may be a single or a multiple layer structure. The substrate 101 may include an insulating layer, a conductive layer, a semiconductor layer, or a combination thereof. The substrate 101 may include a silicon substrate. The substrate 101 may include a silicon substrate in which a shallow trench isolation (STI) is formed. The etch target layer 102 may be a single or a multiple layer. The etch target layer 102 may include an insulating layer, a conductive layer, a semiconductor layer, or a combination thereof. The etch target layer 102 may include a metal layer. The etch target layer 102 may be a stack of a metal layer and an insulating layer. In another embodiment, the etch target layer 102 may be a material for forming a bit line structure. For example, the etch target layer 102 may be a stack in which a barrier layer, a bit line layer, and a hardmask layer are sequentially stacked in the recited order. The barrier layer may include TiN, TiSiN, WN, WSiN, and a combination thereof. The bit line layer may include a metal layer. The bit line layer may include a tungsten layer. The hardmask layer may include nitride, oxide, carbon, polysilicon, spin on carbon (SOC), or a combination thereof.

The hardmask layer may be formed on the etch target layer 102. The hardmask layer may be a single or a multiple layer. For example, the hardmask layer having a multiple layer may include a stack of a first hardmask layer 103 and a second hardmask layer 104. The first hardmask layer 103 may include a material having an etch selectivity with respect to the etch target layer 102. The first hardmask layer 103 may include nitride, oxide, amorphous carbon, anti-reflection coating layer (ARC), polysilicon, spin on carbon (SOC), or a combination thereof. The second hardmask layer 104 may be formed on the first hardmask layer 103. The second hardmask layer 104 may include a material having an etch selectivity with respect to the first hardmask layer 103. The second hardmask layer 104 may include nitride, oxide, amorphous carbon, ARC, polysilicon, SOC, or a combination thereof. The first and second hardmask layers 103 and 104 may be made of different materials. In another embodiment, the first hardmask layer 103 may be omitted and only the second hardmask layer 104 may be formed.

A patterned mask layer 105 may be formed on the second hardmask layer 104. The patterned mask layer 105 may include a photoresist. The patterned mask layer 105 may be formed, for example, by photolithography.

A first spacer layer 106A may be formed on the patterned mask layer 105 (refer to FIG. 1A). The first spacer layer 106A may be formed to cover the patterned mask layer 105 and any exposed part of the top surface of the second hardmask layer 104 that is not covered by the patterned mask layer 105. The first spacer layer 106A may be formed, for example, by atomic layer deposition (ALD) or chemical vapor deposition (CVD). The first spacer layer 106A may include a material having an etch selectivity with respect to the second hardmask layer 104. For example, in an embodiment, the second hardmask layer 104 may be formed of or include polysilicon, and the first spacer layer 106A may be formed of or include silicon oxide or silicon nitride.

A first sacrificial spacer 106 may be formed on sidewalls of the patterned mask layer 105 (refer to FIG. 1B). The first sacrificial spacer 106 may have a shape covering the sidewalls of the patterned mask layer 105. The first sacrificial spacer 106 may have a closed-loop shape when looked from the top. For example, the closed loop shape may include a quadrilateral shape such as a rectangular shape or a curved shape such as a ring shape.

An etching process may be performed on the first spacer layer 106A (of FIG. 1A) to form the first sacrificial spacer 106. The etching process of the first spacer layer 106A may include dry etching. The first sacrificial spacer 106 may include a material having an etch selectivity with respect to the second hardmask layer 104. The first sacrificial spacer 106 may include silicon oxide.

FIG. 1C is a plane view taken along a direction A-A' of FIG. 1B. The patterned mask layer 105 may have a linear shape extending in any one direction, that is in a first direction D1. The first sacrificial spacer 106 may have a closed-loop shape covering sidewalls of the patterned mask layer 105. The patterned mask layers 105 adjacent to each other may be parallel to each other along a second direction D2. The first and second directions D1 and D2 may intersect perpendicularly.

Figure 2A:
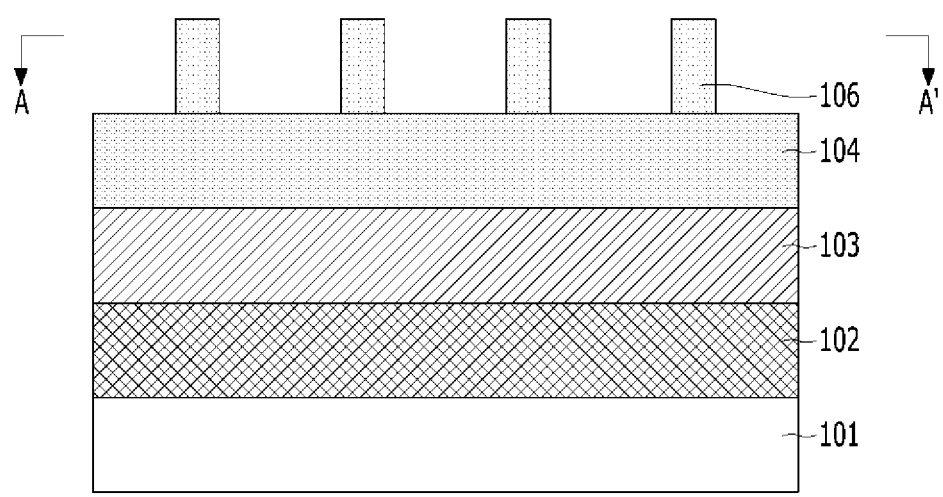
Figure 2B:
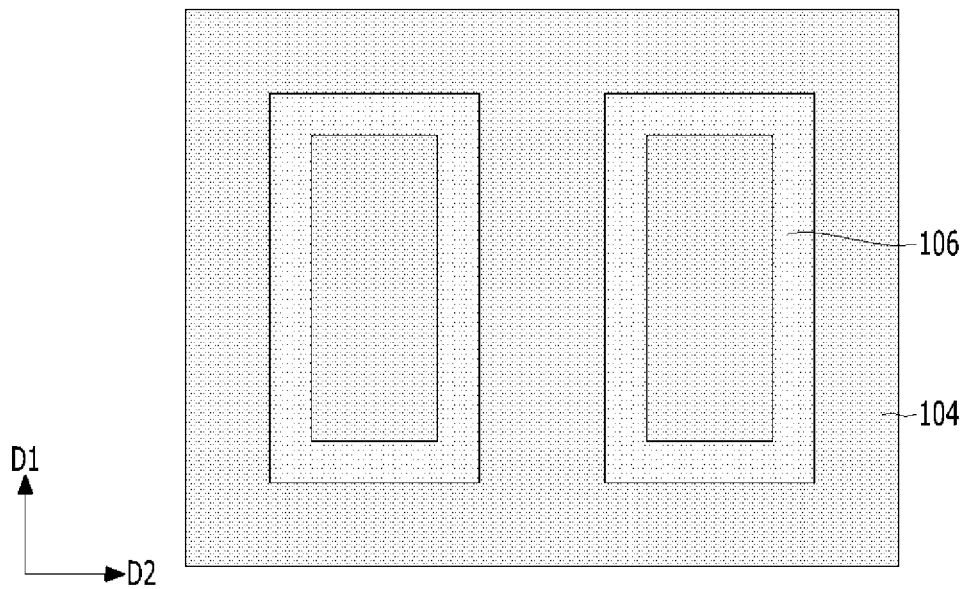

As shown in FIGS. 2A and 2B, the patterned mask layer 105 may be removed. Accordingly, the first sacrificial spacer 106 may remain on the second hardmask layer 104. FIG. 2B is a plane view taken along a direction A-A' of FIG. 2A. The second hardmask layer 104 may be partially exposed in the inner lower and outer lower portions of the first sacrificial spacer 106.

Figure 3A:
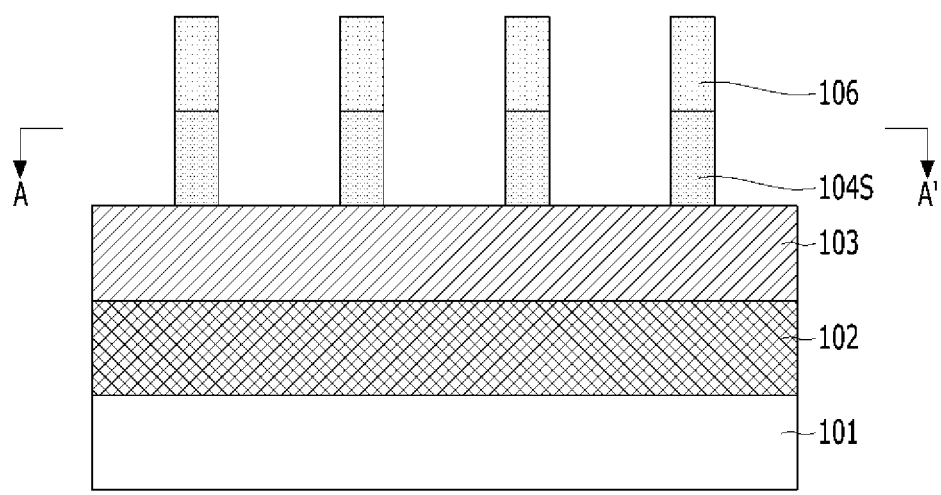
Figure 3B:
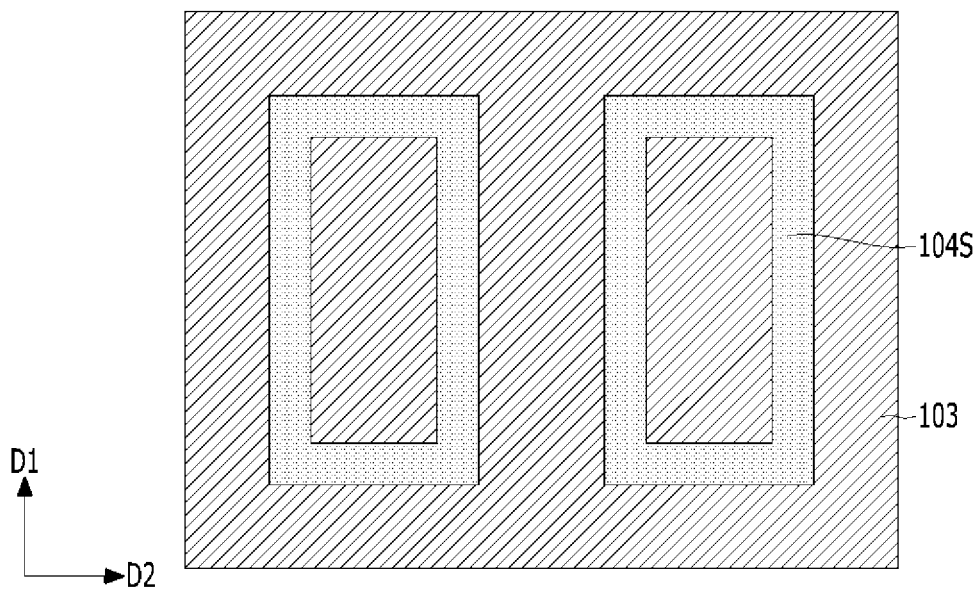

As shown in FIGS. 3A and 3B, the second hardmask layer 104 may be etched by using the first sacrificial spacer 106 as an etching barrier. Accordingly, a first spacer 104S may be formed on the first hardmask layer 103. The first spacer 104S may have the same shape as the first sacrificial spacer 106. FIG. 3B is a plane view taken along a direction A-A' of FIG. 3A. The first spacer 104S may be a spacer having a closed-loop shape. The first hardmask layer 103 may be partially exposed in the inner lower and outer lower portions of the first spacer 104S.

Figure 4A:
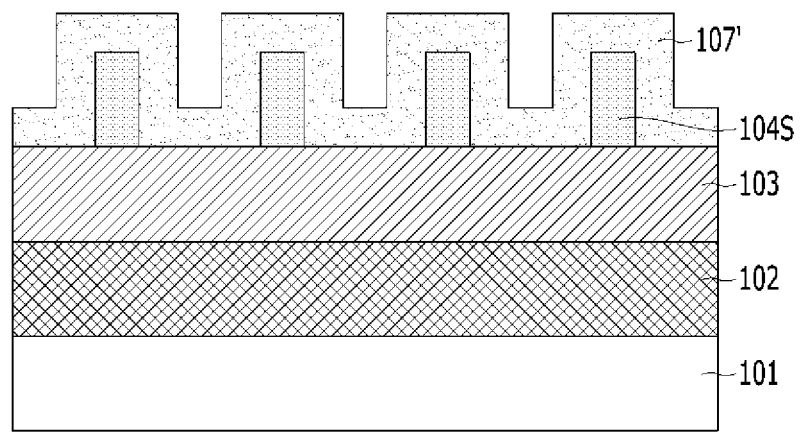
Figure 4B:
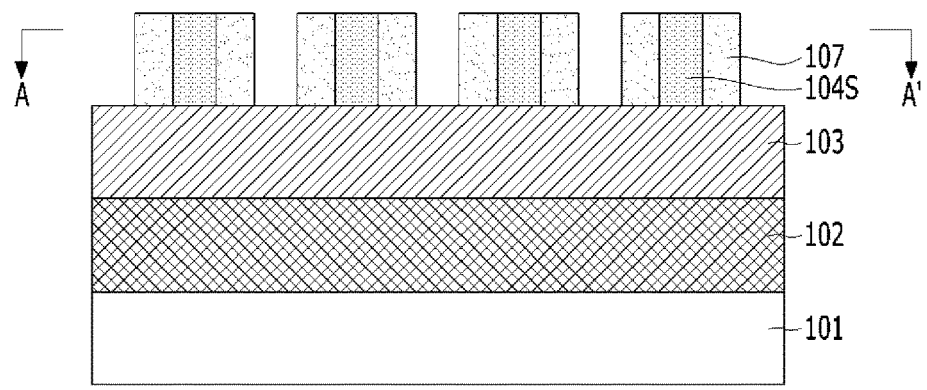
Figure 4C:
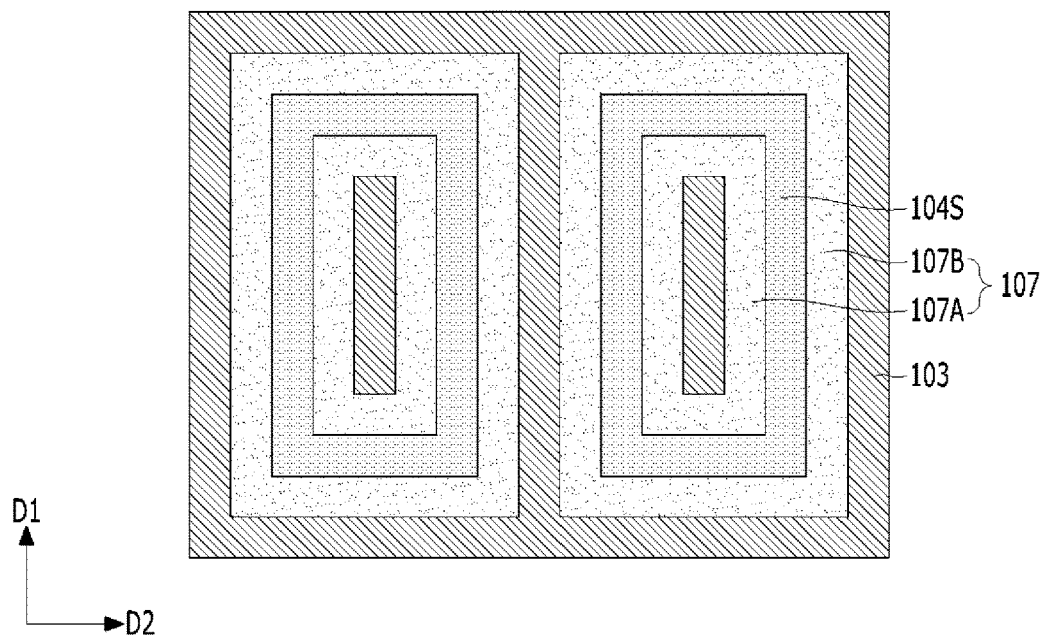

As shown in FIGS. 4A to 4C, a second sacrificial spacer 107 may be formed on sidewalls of the first spacer 104S after removing the first sacrificial spacer 106. The second sacrificial spacer 107 may have a shape covering the sidewalls of the first spacer 104S. The second sacrificial spacer 107 may have a closed-loop shape. A deposition and etching process of the second spacer layer 107' (of FIG. 4A) may be performed to form the second sacrificial spacer 107. The second sacrificial spacer 107 may include a material having an etch selectivity with respect to the first hardmask layer 103. The second sacrificial spacer 107 may include silicon oxide.

FIG. 4C is a plane view taken along a direction A-A' of FIG. 4B, and the second sacrificial spacer 107 may be formed on inner and outer sidewalls of the first spacer 104S. For example, the second sacrificial spacer 107 may include an inner second spacer 107A and an outer second spacer 107B. The inner second spacer 107A may be formed on the inner sidewalls of the first spacer 104S, and the outer second spacer 107B may be formed on the outer sidewalls of the first spacer 104S. Each of the inner second spacer 107A and the outer second spacer 107B may have a closed-loop shape.

Figure 5A:
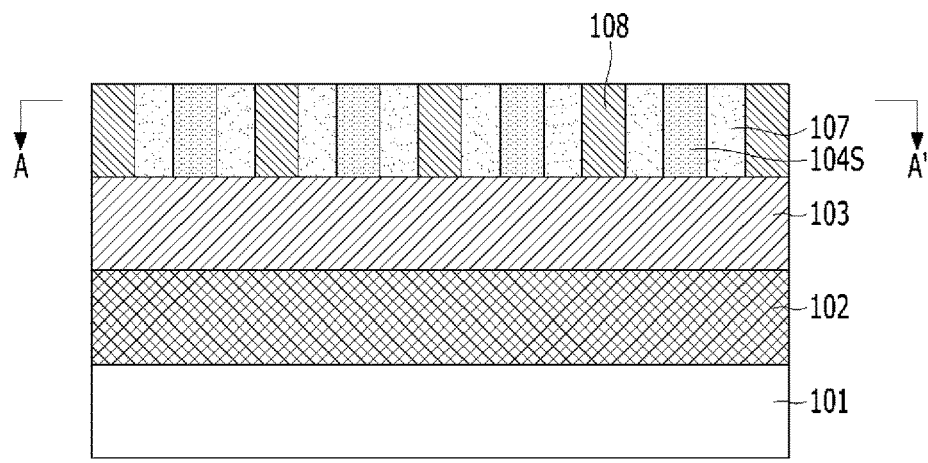
Figure 5B:
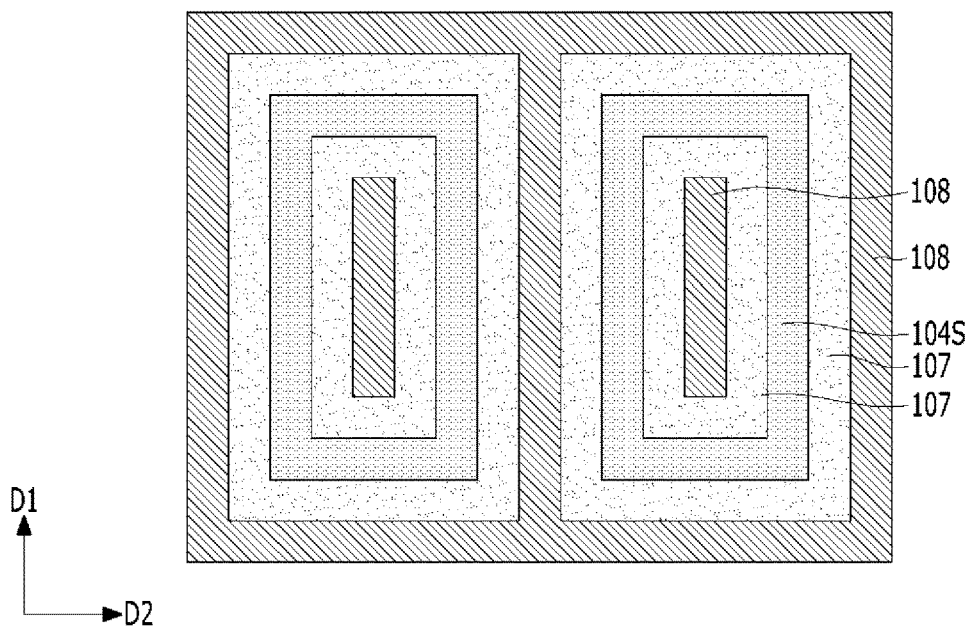

FIG. 5B is a plane view taken along a direction A-A' of FIG. 5A. As shown in FIGS. 5A and 5B, a second spacer 108 may be formed. For example, a third spacer layer (not shown) may be formed over the structure of FIGS. 4A and 4B, and an etching or planarization process of the third spacer layer may be performed to form the second spacer 108. The second spacer 108 may fill the space inside the inner second spacer 107A, and may be formed on the outer sidewalls of the outer second spacer 107B. A space between adjacent outer second spacers 107B may be filled with the second spacer 108.

The first and second spacers 104S and 108 may be made of different materials. The first and second spacers 104S and 108 may have different etch rates.

A series of processes for forming a spacer, as described above, is referred to as a spacer on spacer (SOS) process. The SOS process according to an embodiment of the present invention includes processes of forming the first spacer 104S by using the first sacrificial spacer 106 as an etching barrier, forming the second sacrificial spacer 107 on the first spacer 104S, and forming the second spacer 108 on the second sacrificial spacer. When the SOS process is applied, fine pitch patterns may be easily formed.

Figure 6A:
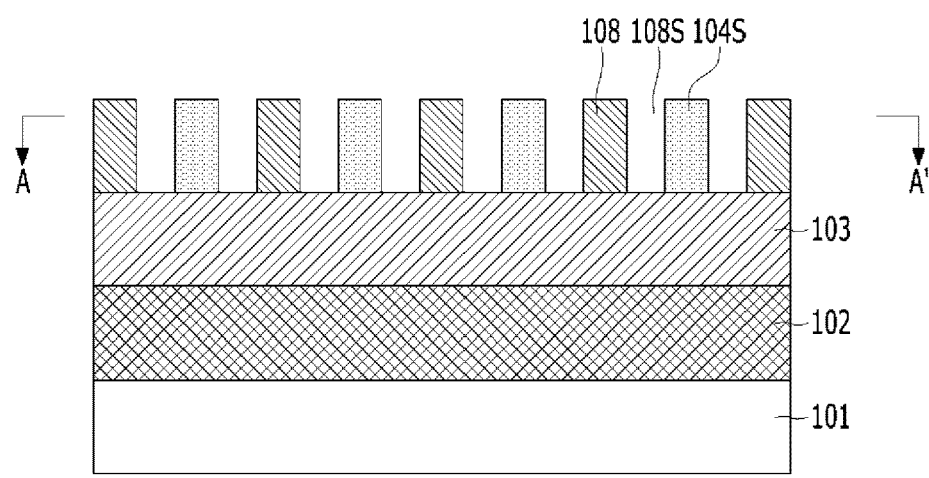
Figure 6B:
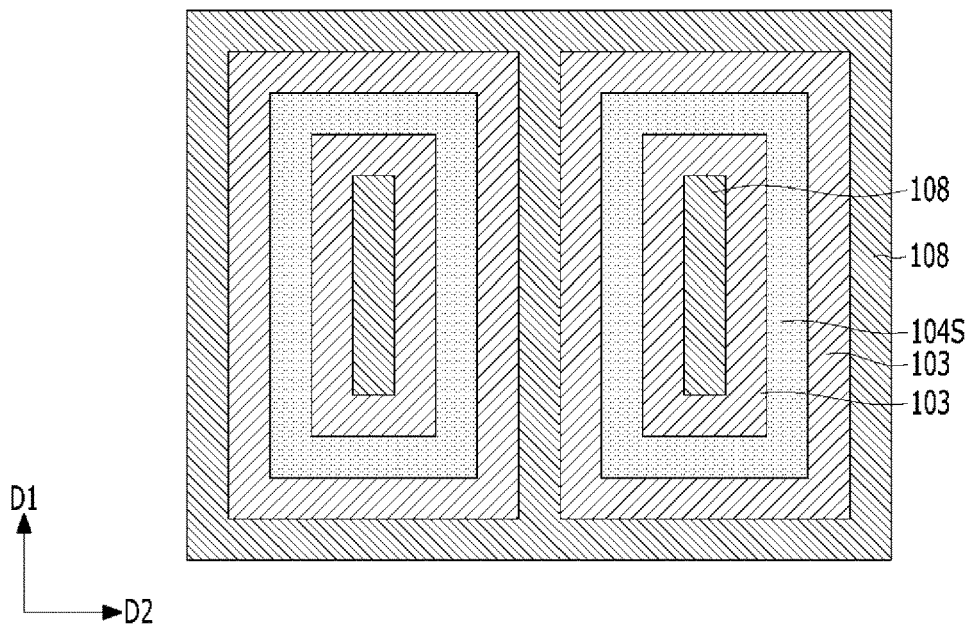

As shown in FIGS. 6A and 6B, the second sacrificial spacer 107, that is the inner second spacer 107A and the outer second spacer 107B, may be removed. Accordingly, openings 108S may be defined between the first and second spacers 104S and 108. FIG. 6B is a plane view taken along a direction A-A' of FIG. 6A. Each opening 108S is a space in which the second sacrificial spacer 107 is removed and may have a closed-loop shape. The surface of the first hardmask layer 103 may be partially exposed through the openings 108S.

The first spacer 104S and the second spacer 108, remaining after the second sacrificial spacer 107 is removed, are referred to as a spacer structure. The first and second spacers 104S and 108 may be alternately disposed and spaced apart from each other at a constant interval along the second direction D2. Each of the first and second spacers 104S and 108 may have a closed-loop shape.

Figure 7A:
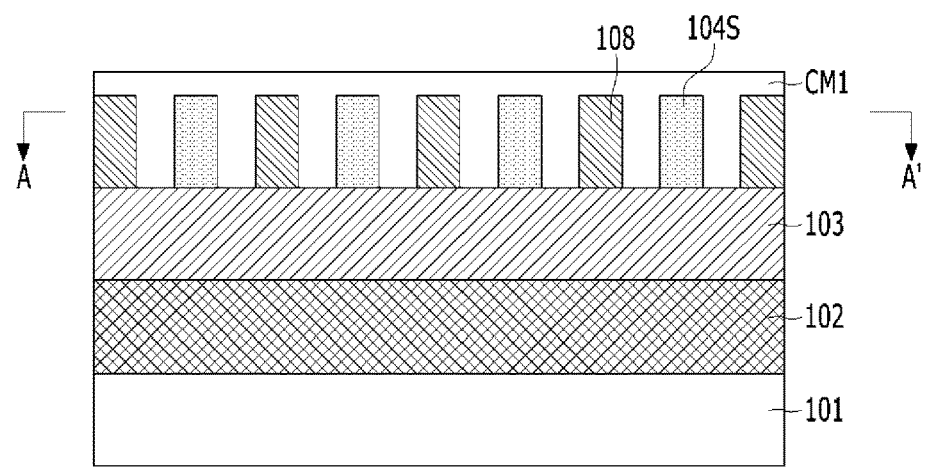
Figure 7B:
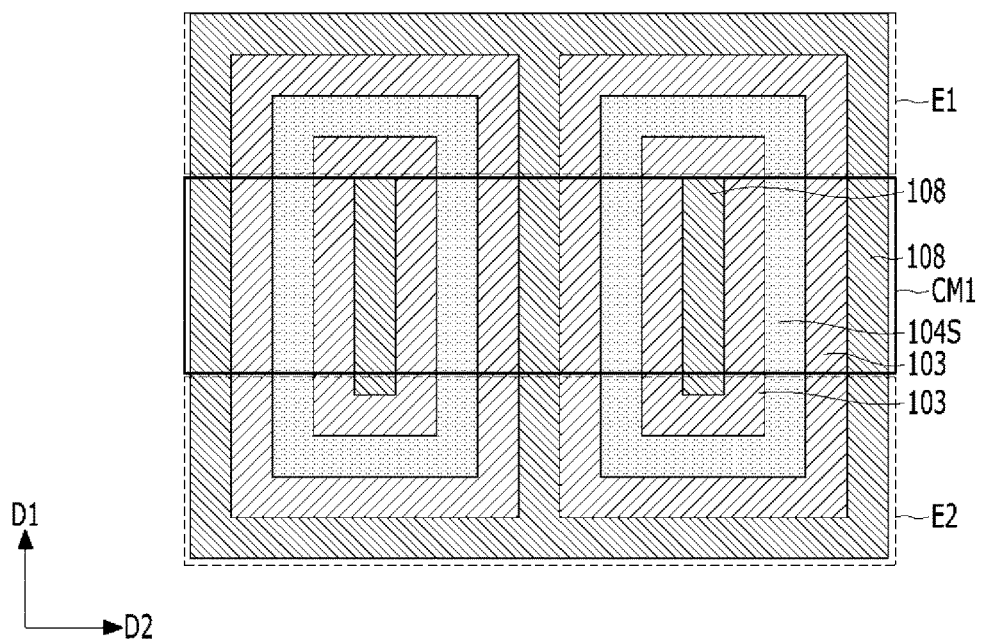

As shown in FIGS. 7A and 7B, a first cut mask layer CM1 may be formed on the structure of FIGS. 6A and 6B. FIG. 7B is a plane view taken along a direction A-A' of FIG. 7A. The first cut mask layer CM1 may include a material having an etch selectivity with respect to the first spacer 104S or the second spacer 108. In an embodiment, the first cut mask layer CM1 may include a photoresist. The first cut mask layer CM1 may have a flat plate shape partially blocking the first and second spacers 104S and 108. The first cut mask layer CM1 may have an elongated rectangular shape extending in a second direction D2 intersecting perpendicularly with the first direction D1 which is the direction in which the first and second spacers 104S and 108 extend along their long direction. The first cut mask layer CM1 may block middle portions of the first and second spacers 104S and 108 while exposing first and second end portions E1 and E2 on either side of the middle portion of the first and second spacers 104S and 108. The first cut mask layer CM1 may asymmetrically expose the end portions E1 and E2 of the first and second spacers 104S and 108. In other words, the first end portion E1 of the second spacer 108 and the first spacer 104S may have an exposed area smaller than that of the second end portion E2 of the second spacer 108 and the first spacer 104S. The first and second end portions E1 and E2 refer to portions which may be removed by an etching process using the first cut mask layer CM1.

In the present embodiment, the first cut mask layer CM1 may be an etching barrier for etching the first and second end portions E1 and E2 of the second spacer 108. The first mask layer CM1 may be referred to as a closed mask layer or a blocking mask layer.

Figure 8A:
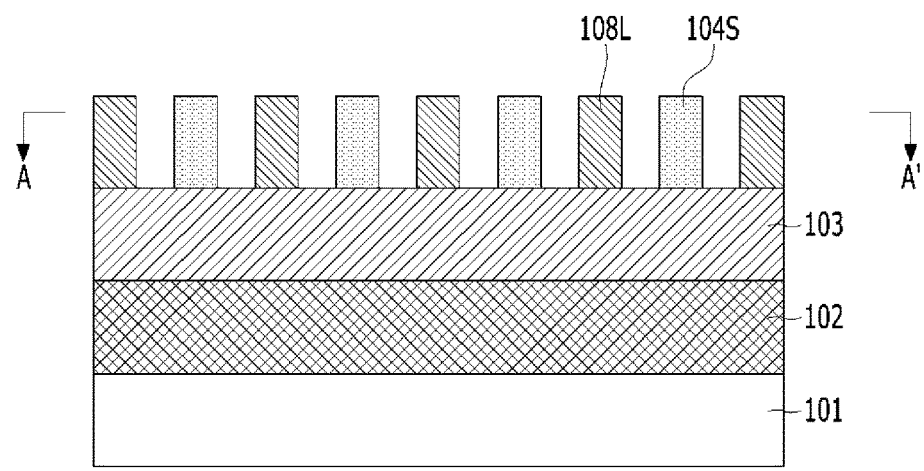
Figure 8B:
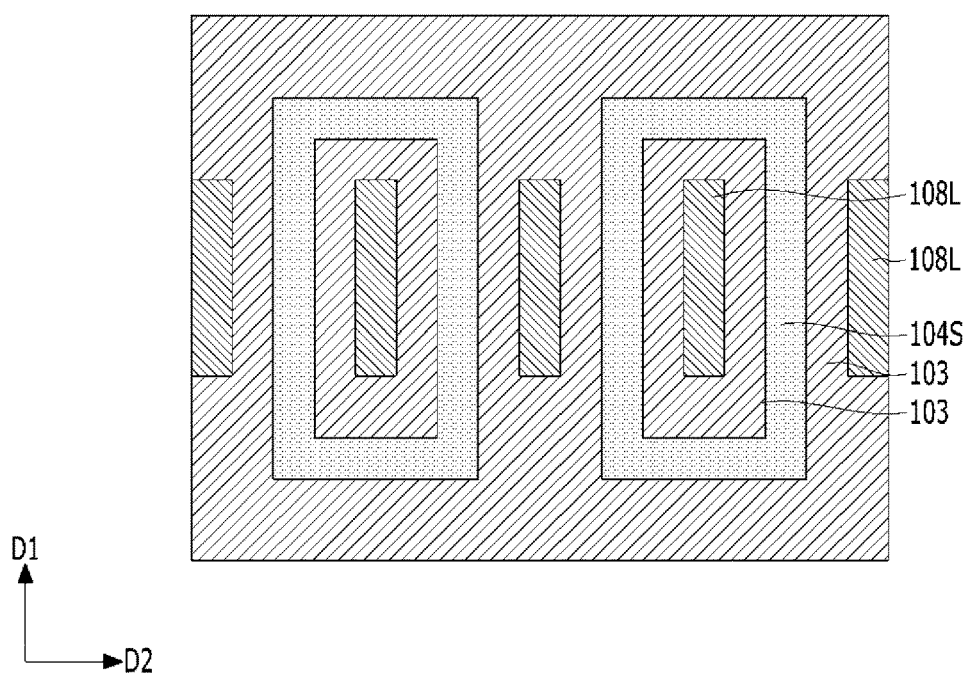

As shown in FIGS. 8A and 8B, the first and second end portions E1 and E2 of the second spacer 108 may be etched using the first cut mask layer CM1 as an etching barrier to form a second spacer line 108L. FIG. 8B is a plane view taken along a direction A-A' of FIG. 8A. The second spacer line 108L may have a linear shape extending in any one direction, for example, in direction D1 as illustrated in FIG. 8B. The first spacer 104S may be disposed between adjacent second spacer lines 108L. More specifically, the first spacer 104S may be formed in a rectangular loop shape to surround every other second spacer line 108L disposed along the second direction D2. The first spacer 104S may not contact the second spacer line 108L. Thus, referring to FIG. 8B, a plurality of second spacer lines 108L may be formed to be spaced apart from each other at a constant interval along the second direction D2 while each one is extending along its long axis in the first direction D1. Also, a plurality of rectangular loop shape first spacers 104S may be formed to be spaced apart from each other and from the second spacer lines 108L while surrounding every other second spacer line 108L. Each of the exposed portions of the first spacer 104S may not be etched during when the first and second end portions E1 and E2 of the second spacer 108 are etched. That is, an etching process may be performed using a chemical selectively etching the end portion of the second spacer 108 among the end portions of the first and second spacers 104S and 108.

Subsequently, the first cut mask layer CM1 may be removed.

Figure 9A:
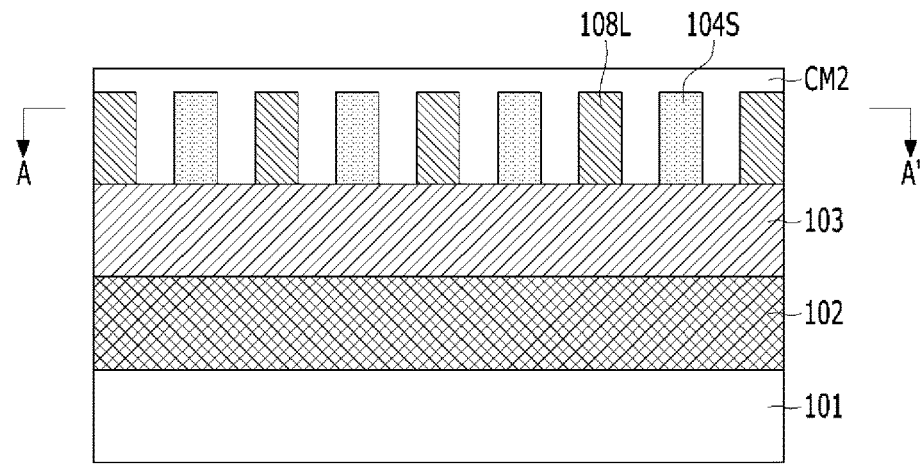
Figure 9B:
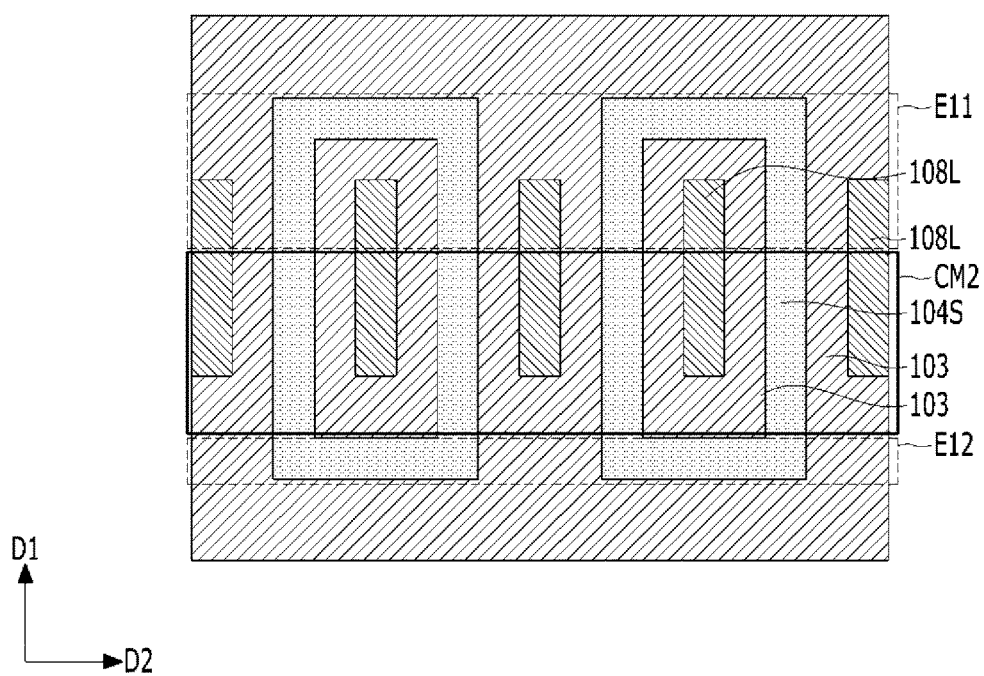

As shown in FIGS. 9A and 9B, a second cut mask layer CM2 may be formed to cover a portion of the second spacer lines 108L and first spacers 104S. The second cut mask CM2 may include a material having an etch selectivity with respect to the first spacer 104S or the second spacer line 108L. In this embodiment, the second cut mask layer CM2 may include a photoresist. FIG. 9B is a plane view taken along a direction A-A' of FIG. 9A, and the second cut mask layer CM2 may have a flat plate shape partially blocking the first spacer 104S. The second cut mask layer CM2 may extend in a direction which is intersecting with the first spacers 104S. The second cut mask layer CM2 may block a middle portion of the first spacer 104S while exposing both end portions E11 and E12 of the first spacer 104S on either side of the middle portion of the first spacer 104S. The second cut mask layer CM2 may asymmetrically expose the end portions E11 and E12 of the first spacer 104S. In other words, the first end portion E11 of the first spacer 104S may have an exposed area smaller than that of the second end portion E12 of the first spacer 104S. The first and second end portions E11 and E12 may refer to portions which may be removed by an etching process using the second cut mask layer CM2.

In this embodiment, the second cut mask layer CM2 may be an etching barrier for etching the first and second end portions E11 and E12 of the first spacer 104S. The second cut mask layer CM2 may also be referred to as a closed mask layer or a blocking mask layer.

The second cut mask layer CM2 may partially block the second spacer lines 108L. An end of the second spacer line 108L adjacent to the first end portion E11 of the first spacer 104S may be selectively exposed by the second cut mask layer CM2.

Figure 10A:
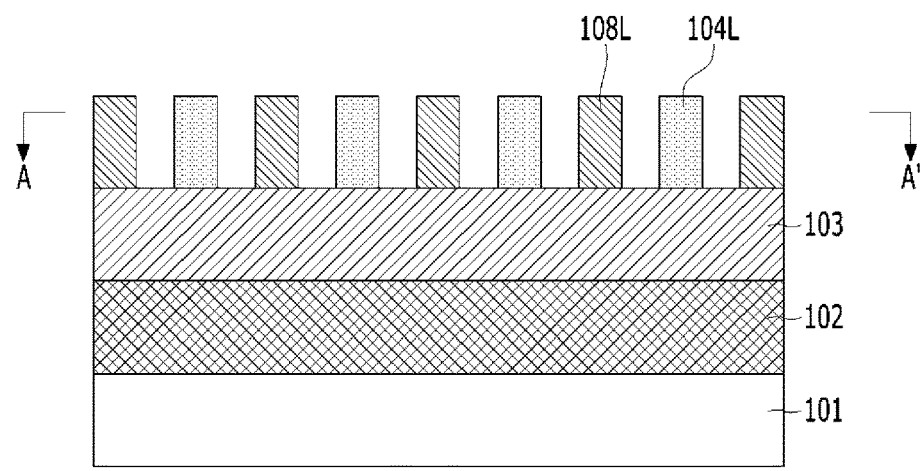
Figure 10B:
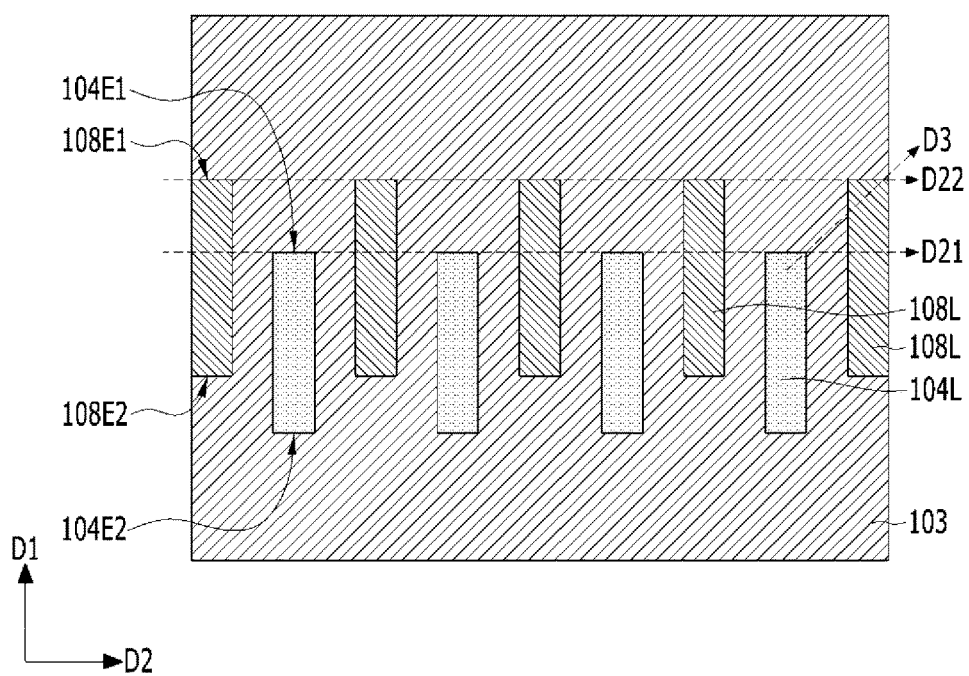

As shown in FIGS. 10A and 10B, the first end portion E11 and the second end portion E12 of the first spacer 104S may be etched using the second cut mask layer CM2 as an etching barrier.

Accordingly, first spacer lines 104L may be formed. FIG. 10B is a plane view taken along a direction A-A' of FIG. 10A, and the first spacer lines 104L may have a linear shape extending in any one direction. e.g., as illustrated in FIG. 10B in the first direction D1. The second spacer line 108L may be disposed between adjacent first spacer lines 104L. The first spacer lines 104L and the second spacer lines 108L may be alternately disposed along the second direction D2.

While etching the first end portion E11 and the second end portion E12 of the first spacer 104S, exposed portions of the second spacer line 108L may not be etched. That is, etching may be performed using a chemical selectively etching the end portion of the first spacer 104S among the end portions of the first spacer 104S and the second spacer line 108L.

Subsequently, the second cut mask layer CM2 may be removed.

The first spacer lines 104L and the second spacer lines 108L may have the same length. Each of the first spacer lines 104L may include a first end 104E1 and a second end 104E2. Each of the second spacer lines 108L may include a first end 108E1 and a second end 108E2. The first ends 104E1 of the first spacer lines 104L and the first ends 108E1 of the second spacer lines 108L may be arranged in a zig-zag manner. Therefore, the first ends 104E1 of the first spacer lines 104L and the first ends 108E1 of the second spacer lines 108L may not be disposed on the same straight line. The second ends 104E2 of the first spacer lines 104L and the second ends 108E2 of the second spacer lines 108L may be arranged in a zig-zag manner, and accordingly, the second ends 104E2 of the first spacer lines 104L and the second ends 108E2 of the second spacer lines 108L may not be disposed on the same straight line.

The first spacer lines 104L and the second spacer lines 108L may be parallel to each other along the second direction D2, and may each have a shape extending in the first direction D1.

The first ends 104E1 of the first spacer lines 104L may be arranged to be aligned with the second direction D2. The second ends 104E2 of the first spacer lines 104L may be arranged to be aligned with the second direction D2. The first ends 104E1 of the first spacer lines 104L may be disposed on the same straight line along the second direction D2, and the second ends 104E2 of the first spacer lines 104L may be disposed on the same straight line along the second direction D2.

The first ends 108E1 of the second spacer lines 108L may be arranged to be aligned with the second direction D2. The second ends 108E2 of the second spacer lines 108L may be arranged to be aligned with the second direction D2. The first ends 108E1 of the second spacer lines 108L may be disposed on the same straight line along the second direction D2, and the second ends 108E2 of the second spacer lines 108L may be disposed on the same straight line along the second direction D2.

The second direction D2 may include a third direction D21 and a fourth direction D22 that are parallel to each other, and the third direction D21 and the fourth direction D22 may perpendicularly intersect with the first direction D1. For example, the first ends 104E1 of the first spacer lines 104L may be arranged to be aligned along a same line parallel to the third direction D21. The first ends 108E1 of the second spacer lines 108L may be arranged to be aligned along a same line parallel to the fourth direction D22. The first ends 104E1 of the first spacer lines 104L and the first ends 108E1 of the second spacer lines 108L may be arranged to be aligned along a same line parallel to a fifth direction D3 that obliquely crosses the third and fourth directions D21 and D22. The second ends 104E2 of the first spacer lines 104L may be arranged to be aligned along a same line parallel to the third direction D21. The second ends 108E2 of the second spacer lines 108L may be arranged to be aligned along a same line parallel to the fourth direction D22. The second ends 104E2 of the first spacer lines 104L and the second ends 108E2 of the second spacer lines 108L may be arranged to be aligned along a same line parallel to the fifth direction D3 that obliquely crosses the third and fourth directions D21 and D22.

Since the ends adjacent to each other are disposed at an angle as described above, the first and second ends 104E1 and 104E2 of the first spacer lines 104L may not be disposed on the same straight line with the first and second ends 108E1 and 108E2 of the second spacer lines 108L, respectively.

A sufficiently large distance between the first ends 104E1 of the first spacer lines 104L and the first ends 108E1 of the second spacer lines 108L may be secured by the zig-zag arrangement of the first ends 104E1 and 108E1 as described above. In addition, by arranging the second ends 104E2 and 108E2 in a zig-zag manner, a sufficiently large distance between the second ends 104E2 of the first spacer lines 104L and the second ends 108E2 of the second spacer lines 108L may be secured.

Figure 11A:
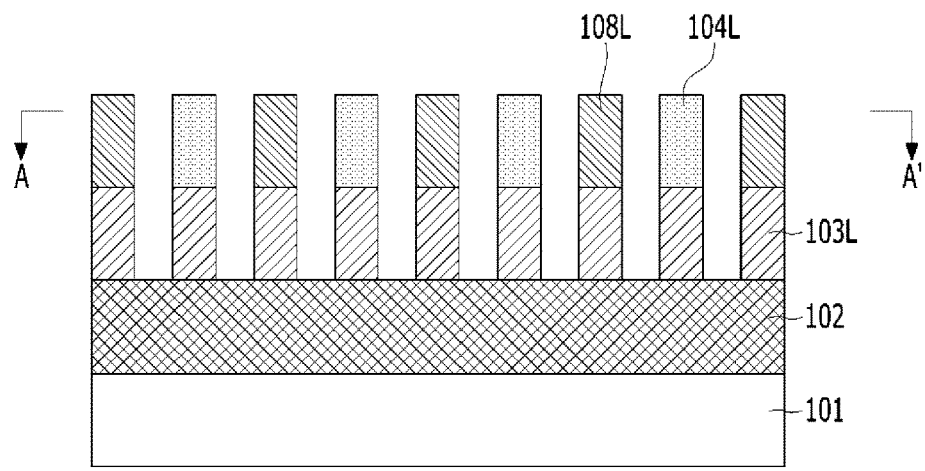
Figure 11B:
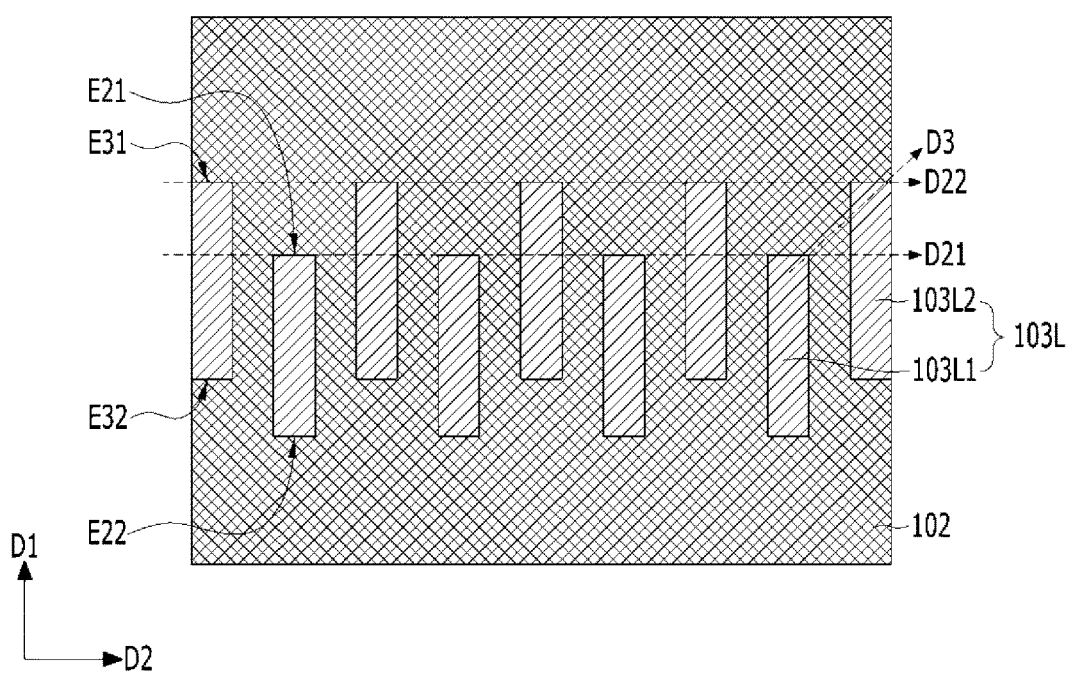

As shown in FIGS. 11A and 11B, the first hardmask layer 103 may be etched using the first spacer lines 104L and the second spacer lines 108L as etching barriers. Accordingly, first hardmask layer lines 103L may be formed on the etch target layer 102. When the first hardmask layer 103 is omitted, the etch target layer 102 may be etched using the first spacer lines 104L and the second spacer lines 108L as etching barriers.

FIG. 11B is a plane view taken along a direction A-A' of FIG. 11A, and the first hardmask layer lines 103L may have a linear shape extending in any one direction, e.g., the first direction D1. Hereinafter, the first hardmask layer lines 103L are abbreviated as etch mask lines 103L. The etch mask lines 103L may include first line portions 103L1 and second line portions 103L2. The first line portions 103L1 and the second line portions 103L2 may be alternately disposed. The first line portions 103L1 may have the same shape as the first spacer lines 104L, and the second line portions 103L2 may have the same shape as the second spacer lines 108L.

Each of the first line portions 103L1 may include a first end E21 and a second end E22. Each of the second line portions 103L2 may include a first end E31 and a second end E32. The first ends E21 of the first line portions 103L1 and the first ends E31 of the second line portions 103L2 may be arranged in a zig-zag manner. Accordingly, the first ends E21 of the first line portions 103L1 and the first ends E31 of the second line portions 103L2 may not be disposed on the same straight line. The second ends E22 of the first line portions 103L1 and the second ends E32 of the second line portions 103L2 may be arranged in a zig-zag manner. Accordingly, the second ends E22 of the first line portions 103L1 and the second ends E32 of the second line portion 103L2 may not be disposed on the same straight line.

The first line portions 103L1 and the second line portions 103L2 may be parallel to each other along the second direction D2, and may each have a shape extending in the first direction D1.

The first ends E21 of the first line portions 103L1 may be arranged to be aligned with the second direction D2. The second ends E21 of the first line portions 103L1 may be arranged to be aligned with the second direction D2. The first ends E21 of the first line portions 103L1 may be disposed on the same straight line along the second direction D2, and the second ends E22 of the first line portions 103L1 may be disposed on the same straight line along the second direction D2.

The first ends E31 of the second line portions 103L2 may be disposed to be aligned with the second direction D2. The second ends E32 of the second line portions 103L2 may be disposed to be aligned with the second direction D2. The first ends E31 of the second line portions 103L2 may be disposed on the same straight line along the second direction D2, and the second ends E32 of the second line portions 103L2 may be disposed on the same straight line along the second direction D2.

The second direction D2 may include the third direction D21 and the fourth direction D22 that are parallel to each other, and the third direction D21 and the fourth direction D22 may perpendicularly intersect with the first direction D1. For example, the first ends E21 of the first line portions 103L1 may be arranged to be aligned along a same line parallel to the third direction D21. The first ends E31 of the second line portions 103L2 may be arranged to be aligned along a same line parallel to the fourth direction D22. The first ends E21 of the first line portions 103L1 and the first ends E31 of the second line portions 103L2 may be arranged to be aligned along a same line parallel to the fifth direction D3 that obliquely crosses the third and fourth directions D21 and D22. The second ends E22 of the first line portions 103L1 may be arranged to be aligned along a same line parallel with the third direction D21. The second ends E32 of the second line portions 103L2 may be arranged to be aligned along a same line parallel with the fourth direction D22. The second ends E22 of the first line portions 103L1 and the second ends E32 of the second line portions 103L2 may be arranged to be aligned along a same line parallel to the fifth direction D3 that obliquely crosses the third and fourth directions D21 and D22.

Since the ends adjacent to each other are arranged at an angle as described above, the first ends E21 of the first line portions 103L1 and the first ends E31 of the second line portions 103L2 may not be disposed on the same straight line. The second ends E22 of the first line portions 103L1 and the second ends E32 of the second line portions 103L2 may not be disposed on the same straight line.

By the arrangement of the first ends E21 and E31 in a zig-zag manner as described above, a sufficiently large distance between the first ends E21 of the first line portions 103L1 and the first ends of the second line portions 103L2 may be secured. In addition, by the arrangement of the second ends E22 and E32 in a zig-zag manner, a sufficiently large distance between the second ends E22 of the first line portions 103L1 and the second ends E32 of the second line portions 103L2 may be secured.

Figure 12A:
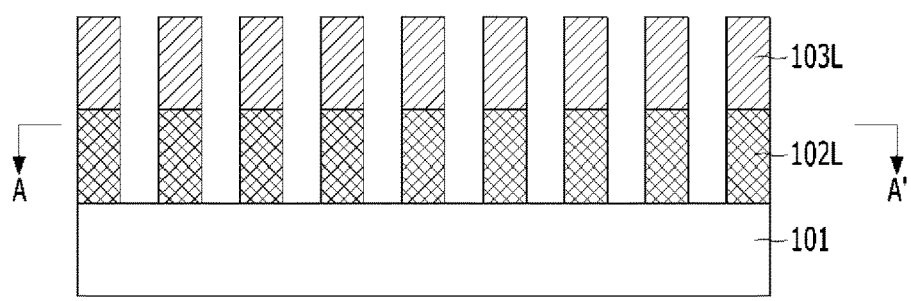
Figure 12B:
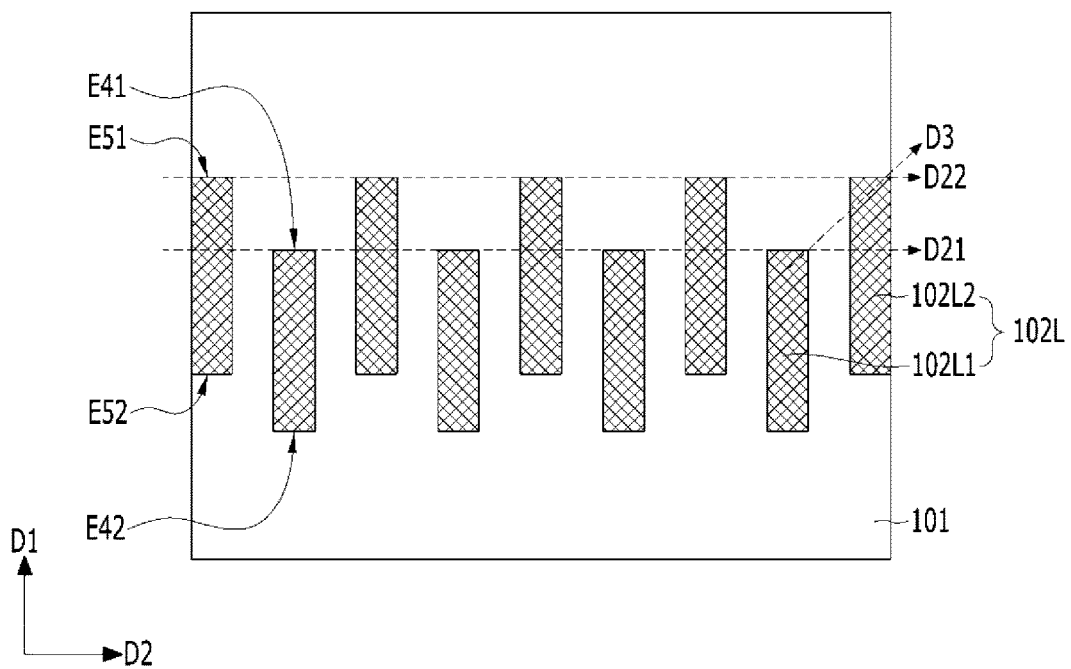

As shown in FIGS. 12A and 12B, after removing the first spacer lines 104L and the second spacer lines 108L, the etch target layer 102 may be etched using the etch mask lines 103L as an etching barrier. Accordingly, a plurality of fine line patterns 102L may be formed on an upper portion of the substrate 101. In another embodiment, the etch target layer 102 may be etched using the first spacer lines 104L, the second spacer lines 108L, and the etch mask lines 103L as etching barriers. In this case, the first spacer lines 104L and the second spacer lines 108L may not remain at the time when the etching process for forming the fine line patterns 102L is completed.

The fine line patterns 102L may include first patterns 102L1 and second patterns 102L2. The first patterns 102L1 and the second patterns 102L2 may be alternately disposed along the second direction D2. The first patterns 102L1 may have the same shape as the first line portions 103L1, and the second patterns 102L2 may have the same shape as the second line portions 103L2 as shown in FIG. 11B. The first patterns 102L1 may be even patterns, and the second patterns 102L2 may be odd patterns.

Each of the first patterns 102L1 may include a first end E41 and a second end E42. Each of the second patterns 102L2 may include a first end E51 and a second end E52. The first ends E41 of the first patterns 102L1 and the first ends E51 of the second patterns 102L2 may be arranged in a zig-zag manner. Accordingly, the first ends E41 of the first patterns 102L1 and the first ends E51 of the second patterns 102L2 may not be disposed on the same straight line. The second ends E42 of the first patterns 102L1 and the second ends E52 of the second patterns 102L2 may be arranged in a zig-zag manner. Accordingly, the second ends E42 of the first patterns 102L1 and the second ends E52 of the second patterns 102L2 may not be disposed on the same straight line.

The first patterns 102L1 and the second patterns 102L2 may be parallel to each other along the second direction D2, and may each have a shape extending in the first direction D1.

The first ends E41 of the first patterns 102L1 may be disposed to be aligned in the second direction D2. The second ends E42 of the first patterns 102L1 may be disposed to be aligned in the second direction D2. The first ends E41 of the first patterns 102L1 may be disposed on the same straight line along the second direction D2, and the second ends E42 of the first patterns 102L1 may be disposed on the same straight line along the second direction D2.

The first ends E51 of the second patterns 102L2 may be disposed on the same straight line along the second direction D2, and the second ends E52 of the second patterns 102L2 may be disposed on the same straight line along the second direction D2.

The second direction D2 may include the third direction D21 and the fourth direction D22 that are parallel to each other, and the third direction D21 and the fourth direction D22 may perpendicularly intersect with the first direction D1. For example, the first ends E41 of the first patterns 102L1 may be arranged to be aligned along a same line parallel to the third direction D21. The first ends E51 of the second patterns 102L2 may be arranged to be aligned along a same line parallel to the fourth direction D22. The first ends E41 of the first patterns 102L1 and the first ends E51 of the second patterns 102L2 may be arranged to be aligned along a same line parallel to the fifth direction D3 that obliquely crosses the third and fourth directions D21 and D22. The second ends E42 of the first patterns 102L1 may be arranged to be aligned along a same line parallel to the third direction D21. The second ends E52 of the second patterns 102L2 may be arranged to be aligned along a same line parallel to the fourth direction D22. The second ends E42 of the first patterns 102L1 and the second ends E52 of the second patterns 102L2 may be arranged to be aligned along a same line parallel to the fifth direction D3 that obliquely crosses the third and fourth directions D21 and D22.

Since the ends adjacent to each other are arranged at an angle as described above, the first ends E41 of the first patterns 102L1 and the first ends E51 of the second patterns 102L2 may not be disposed on the same straight line. The second ends E42 of the first patterns 102L1 and the second ends E52 of the second patterns 102L2 may not be disposed on the same straight line.

By the arrangement of the first ends E41 and E51 in a zig-zag manner as described above, a sufficiently large distance between the first ends E41 of the first patterns 102L1 and the first ends E51 of the second patterns 102L2 may be secured. In addition, by the arrangement of the second ends E42 and E52 in a zig-zag manner, a sufficiently large distance between the second ends E42 of the first patterns 102L1 and the second ends E52 of the second patterns 102L2 may be secured.

Figure 13:
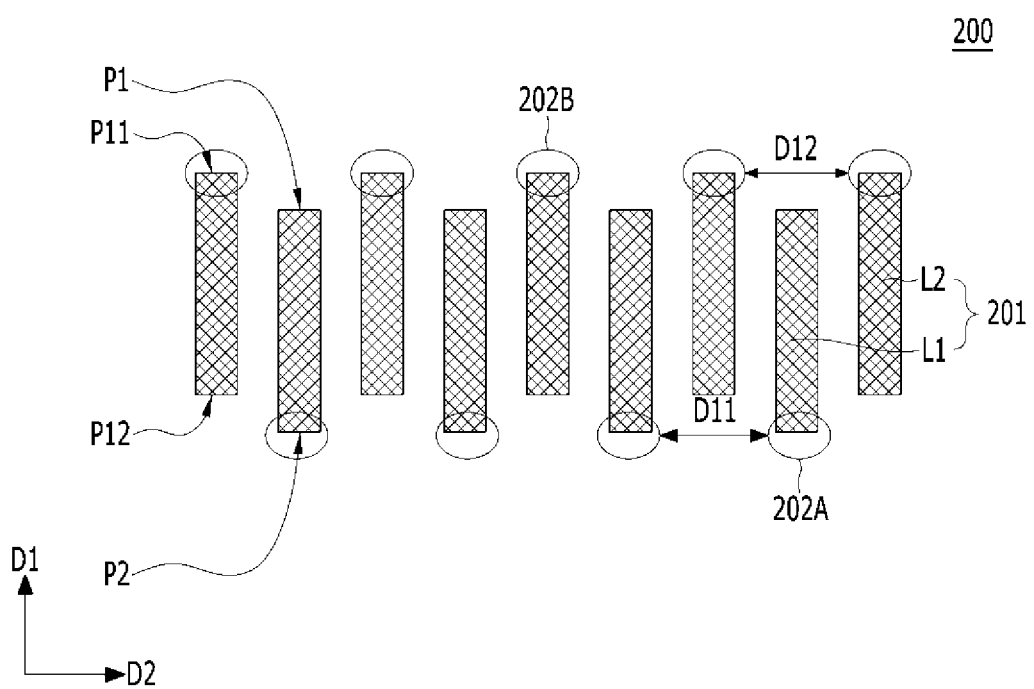
FIG. 13 is a diagram illustrating a semiconductor device according to an embodiment of the present invention.

FIG. 13 is a diagram illustrating a semiconductor device according to an embodiment of the present invention.

Referring to FIG. 13, a semiconductor device 200 may include a plurality of conductive lines 201, and contact plugs 202A and 202B may be connected to ends of the conductive lines 201. Each of the conductive lines 201 may include a word line, bit line, or metal wiring. The conductive lines 201 may include polysilicon, titanium nitride, tungsten, or a stack thereof.

The conductive lines 201 may include first conductive lines L1 and second conductive lines L2. The first conductive lines L1 and the second conductive lines L2 may be alternately disposed. The first conductive lines L1 and the second conductive lines L2 may extend parallel to each other. The first conductive lines L1 and the second conductive lines L2 may have the same width and length. The first conductive lines L1 and the second conductive lines L2 may correspond to the first patterns 102L1 and the second patterns 102L2 of FIG. 12B, respectively. A method for forming the first and second conductive lines L1 and L2 will be described with reference to FIGS. 1A to 12B. The first conductive lines L1 may be even conductive lines, and the second conductive lines L2 may be odd conductive lines.

Each of the first conductive lines L1 may include a first end P1 and a second end P2. Each of the second conductive lines L2 may include a first end P11 and a second end P12. The first ends P1 of the first conductive lines L1 and the first ends P11 of the second conductive lines L2 may be arranged in a zig-zag manner. Accordingly, the first ends P1 of the first conductive lines L1 and the first ends P11 of the second conductive lines L2 may not be disposed on the same straight line. The second ends P2 of the first conductive lines L1 and the second ends P12 of the second conductive lines L2 may be arranged in a zig-zag manner. Accordingly, the second ends P2 of the first conductive lines L1 and the second ends P12 of the second conductive lines L2 may not be disposed on the same straight line.

Contact plugs 202A may be connected to the second ends P2 of the first conductive lines L1, and contact plugs 202B may be connected to the first ends P11 of the second conductive lines L2. The contact plugs 202A and 202B may not be connected to the first ends P1 of the first conductive lines L1, and the contact plugs 202A and 202B may not be connected to the second ends P12 of the second conductive lines L2.

No conductive material may exist between the contact plugs 202A connected to the second ends P2 of the first conductive lines L1 (refer to 'D11'). Accordingly, parasitic capacitance between the contact plugs 202A may be reduced, and a bridge between the second ends P12 of the second conductive lines L2 and the contact plugs 202A may be prevented.

No conductive material may exist between the contact plugs 202B connected to the first ends P11 of the second conductive lines L2 (refer to 'D12'). Accordingly, parasitic capacitance between the contact plugs 202B may be reduced, and a bridge between the first ends P1 of the first conductive lines L1 and the contact plugs 202B may be prevented.

According to FIGS. 1A to 13, line patterns may be formed using double space patterning. The line length of the line patterns may be selectively adjusted by using the first cut mask layer CM1 and the second cut mask layer CM2, thereby improving the contact margin of the even line shape patterns and the odd line shape patterns.

In the present disclosure, spacer lines formed of different materials are cut with two cut mask layers, but the length of the line pattern can be adjusted by using mis-align between the two cut mask layers and the difference in the etch rates of the spacer lines.

Although the disclosure is shown and described with reference to specific embodiments thereof, the present invention is not limited thereto. It will readily be appreciated by one of ordinary skill in the art that various substitutions, changes, or modifications may be made thereto without departing from the scope of the disclosure.

What is claimed is:

1. A method for fabricating a semiconductor device, the method comprising:
    forming a spacer structure in which first and second spacers extending in a first direction are spaced apart from each other and alternately disposed along a second direction on an etch target layer, wherein the first spacers and the second spacers are formed of materials having different etch rates;
    forming first spacer lines having end portions that are aligned with a third direction, the third direction intersecting with the first direction, through selective etching of the first spacers;
    forming second spacer lines having end portions that are aligned with a fourth direction, the fourth direction being parallel with the third direction, through selective etching of the second spacers; and
    etching the etch target layer using the first and second spacer lines to form first line patterns having end portions aligned with the third direction and second line patterns having end portions aligned with the fourth direction.

2. The method according to claim 1, wherein
    end portions of the first line patterns and end portions of the second line patterns include first ends and second ends, the first ends and the second ends facing each other along the first direction,
    the first ends of the first line patterns and the first ends of the second line patterns are adjacent to each other in a zig-zag shape, and
    the second ends of the first line patterns and the second ends of the second line patterns are adjacent to each other in a zig-zag shape.

3. The method according to claim 2, after the etching of the etch target layer, further comprising:
    forming first contact plugs connected to the first ends of the first line patterns and arranged to be aligned with the third direction; and
    forming second contact plugs connected to the second ends of the second line patterns and arranged to be aligned with the fourth direction.

4. The method according to claim 1, wherein the forming of the first spacer lines comprises:
    forming a first cut mask layer selectively exposing end portions of the first and second spacers on the spacer structure; and
    etching an exposed region of the end portions of the first spacers using the first cut mask layer as an etching barrier.

5. The method according to claim 4, wherein the etching of the exposed region of the end portions of the first spacers using the first cut mask layer as an etching barrier includes using a chemical for selectively etching the end portions of the first spacers among the end portions of the first and second spacers.

6. The method according to claim 1, wherein the forming of the second spacer lines comprises:
   forming a second cut mask layer selectively exposing end portions of the first spacer lines and end portions of the second spacers; and
   etching an exposed region of the end portions of the second spacers using the second cut mask layer as an etching barrier.

7. The method according to claim 6, wherein the etching of the exposed region of the end portions of the second spacers using the second cut mask layer as an etching barrier includes using a chemical for selectively etching the end portions of the second spacers among the end portions of the first spacer lines and the second spacers.

8. The method according to claim 1, wherein the forming of the spacer structure comprises:
   forming a hardmask layer on the etch target layer;
   forming sacrificial patterns on the hardmask layer;
   forming a first sacrificial spacer on a sidewall of the sacrificial patterns;
   removing the sacrificial patterns;
   etching the hardmask layer using the first sacrificial spacers as an etching barrier to form the first spacers;
   removing the first sacrificial spacers;
   forming a second sacrificial spacer on both inner and outer sidewalls of the first spacers;
   forming the second spacers on the second sacrificial spacers; and
   removing the second sacrificial spacers.

\* \* \* \* \*